United States Patent [19]

Matsumura et al.

[11] Patent Number: 5,479,369
[45] Date of Patent: Dec. 26, 1995

[54] SEMICONDUCTOR INTEGRATED CIRCUIT DEVICE AND SEMICONDUCTOR MEMORY DEVICE

[75] Inventors: Tetsuya Matsumura; Satoshi Kumaki; Shinichi Nakagawa, all of Hyogo, Japan

[73] Assignee: Mitsubishi Denki Kabushiki Kaisha, Tokyo, Japan

[21] Appl. No.: 375,877

[22] Filed: Jan. 20, 1995

Related U.S. Application Data

[62] Division of Ser. No. 976,055, Nov. 13, 1992, Pat. No. 5,400,295.

[30] Foreign Application Priority Data

Nov. 18, 1991 [JP] Japan .................................. 3-301997

[51] Int. Cl.$^6$ ........................................ G11C 7/00
[52] U.S. Cl. .............. 365/189.05; 365/233; 365/236.08; 326/45; 327/211
[58] Field of Search ............................ 365/189.05, 233, 365/230.08; 326/45, 121; 327/211

[56] References Cited

U.S. PATENT DOCUMENTS

| | | | |
|---|---|---|---|
| 4,766,572 | 8/1988 | Kobayashi | 365/189.05 |
| 4,879,687 | 11/1989 | Okamoto et al. | 365/200 |
| 4,984,201 | 1/1991 | Sato et al. | 365/154 |
| 5,040,143 | 8/1991 | Matsumura et al. | 365/51 |
| 5,107,465 | 4/1992 | Fung et al. | 365/233 |
| 5,280,201 | 1/1994 | Fujimori et al. | 326/112 |
| 5,400,295 | 3/1995 | Matsumura et al. | 365/233 |

FOREIGN PATENT DOCUMENTS

| | | |
|---|---|---|
| 511401 | 11/1992 | European Pat. Off. . |
| 3435752 | 4/1986 | Germany . |
| 3618572 | 12/1986 | Germany . |
| 173795 | 9/1985 | Japan . |

*Primary Examiner*—David C. Nelms
*Assistant Examiner*—Huan Hoang
*Attorney, Agent, or Firm*—Lowe, Price, LeBlanc & Becker

[57] ABSTRACT

In a semiconductor integrated circuit device having a data latch function, one of two inverters constituting a data latch circuit is formed of a PMOS transistor and an NMOS transistor, with the source terminal of the NMOS transistor being connected to a terminal for applying a reset signal. The reset signal is applied to an inverter through the NMOS transistor, and the inverter inverts the reset signal and resets the data latch circuit. Since one inverter of the data latch circuit is formed of the PMOS transistor and the NMOS transistor, the setting/resetting function of the semiconductor integrated circuit device can readily be implemented.

3 Claims, 10 Drawing Sheets

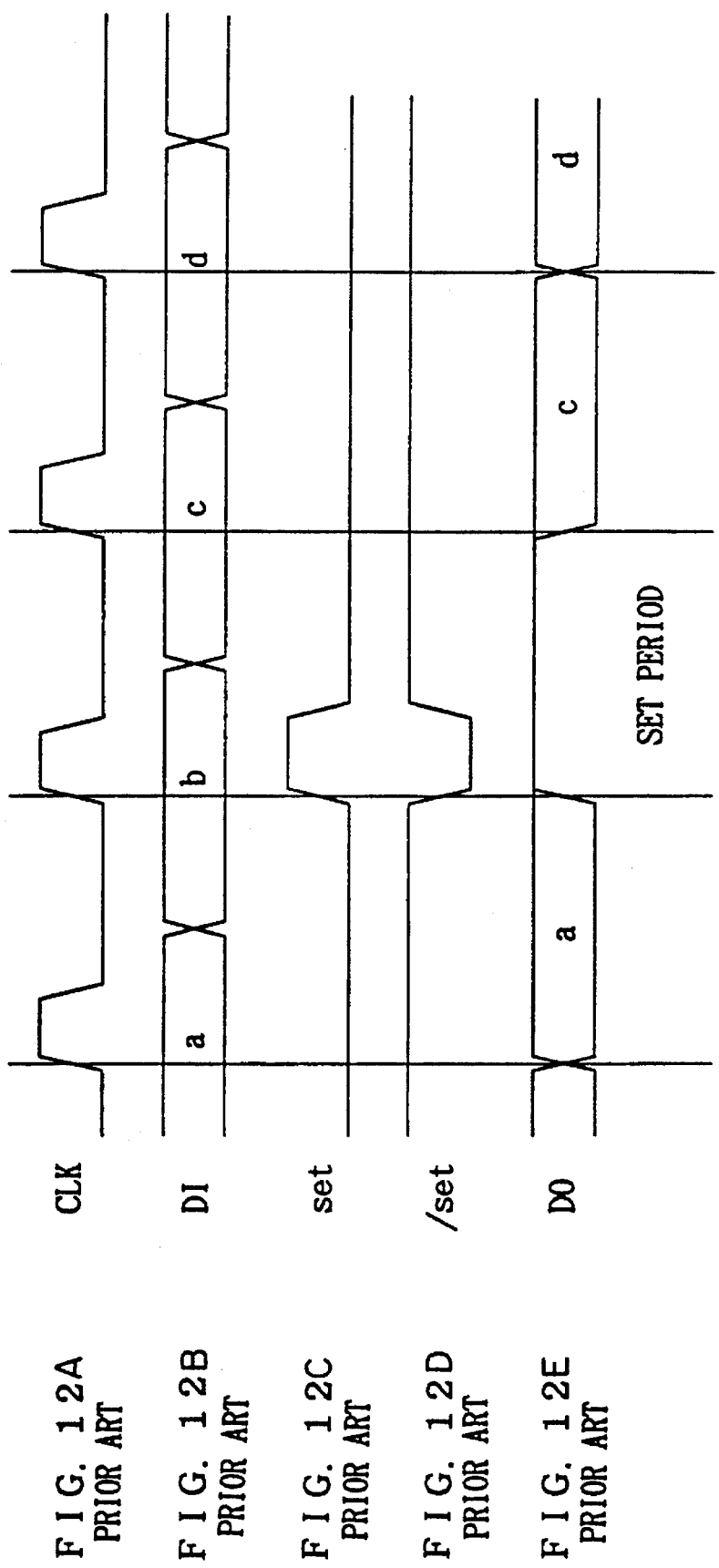

SEMICONDUCTOR INTEGRATED CIRCUIT DEVICE AND SEMICONDUCTOR MEMORY DEVICE

This application is a division of application Ser. No. 07/976,055 filed Nov. 13, 1992, now U.S. Pat. No. 5,400,295.

BACKGROUND OF THE INVENTION

1. Field of the Invention

The present invention relates generally to semiconductor integrated circuit devices and semiconductor memory devices having a data latch function, and more specifically, to improvements of a data latch circuit.

2. Description of the Background Art

A data latch function is mainly constituted by a flipflop circuit, and used in a static memory or a semiconductor integrated circuit device for temporarily holding data. A semiconductor integrated circuit device having such a data latch function together with a setting function or resetting function can achieve easier handling of a signal by controlling an output signal.

The term "reset" herein represents an operation of forcing a latch output to be in an "L" level in accordance with a general idea, while the term "set" represents an operation of forcing a latch output to be in an "H" level. The term "H level" herein represents a power supply potential, and the "L level" a ground potential.

FIG. 7 is a diagram showing a semiconductor integrated circuit device without resetting and setting functions. Referring to FIG. 7, the semiconductor integrated circuit device includes a clock input terminal 4 for receiving a clock signal CLK, a data input terminal 5 for receiving input data DI, and a data output terminal 6 for outputting latched data. The semiconductor integrated circuit device further includes an N channel transistor 10, and inverters 1, 2 and 3. The N channel transistor 10 has its gate electrode connected to the clock input terminal 4, its source electrode connected to the data input terminal 5, and its drain electrode connected to the input of the inverter 1. The inverter 1 has its input terminal connected to the output terminal of the inverter 2 and its output terminal connected to the input terminals of the inverters 2 and 3. More specifically, the inverters 1 and 2 constitute a latch circuit 9. The inverter 2 has its output terminal connected to the data output terminal 6.

FIG. 8 is a timing chart for use in illustration of the semiconductor integrated circuit device shown in FIG. 7. In FIG. 8, a, b, c, and d represent an order of inputting data. Referring to FIG. 8, an operation of the semiconductor integrated circuit device shown in FIG. 7 will be described. The data DI is provided to the data input terminal 5, and the clock signal CLK is applied to the clock input terminal 4. When the clock signal CLK is in the "H" level, the N channel transistor 10 is turned on, transmitting the input data DI to the inverter 1. Thus transmitting data, the N channel transistor 10 is called a transmission gate. The input data DI provided to the inverter 1 is inverted therein, and then applied to the inverters 2 and 3. The inverters 1 and 2 hold the applied data until the next clock signal turns to be the "H" level. Therefore, once the clock signal CLK rises, the data will not be lost if the clock signal CLK falls after that. The inverter 3 inverts the held data and then outputs the inverted data to the data output terminal 6.

FIG. 9 is a circuit diagram showing a semiconductor integrated circuit device having a conventional resetting function. The semiconductor integrated circuit device shown in FIG. 9 is substantially identical to the semiconductor integrated circuit device shown in FIG. 7 with essential differences being that a reset terminal 7 for inputting a reset signal/RESET is additionally provided, and an NAND gate 11 is provided in place of the inverter 1. The NAND gate 11 has two input terminals and one output terminal. One input terminal is connected to the source of the N channel transistor 10 and the output of the inverter 2, the other input terminal is connected to the reset terminal 7, and the output terminal is connected to the input terminals of inverters 2 and 3.

FIG. 10 is a timing chart for use in illustration of the semiconductor integrated circuit device shown in FIG. 9. A description of an operation of the semiconductor integrated circuit device shown in FIG. 9 follows in conjunction with FIG. 10. When the reset signal/RESET is in the "H" level, the output of the NAND gate 11 is decided by the data DI applied from the N channel transistor 10. When the reset signal is in the "H" level, the semiconductor integrated circuit device operates in the same way as the semiconductor integrated circuit device without a latch function shown in FIG. 7.

When the reset signal is in the "L" level, the output of the NAND gate 11 attains the "H" level regardless of data applied from the N channel transistor 10. The inverter 3 receives this "H" level signal and supplies the "L" level output to the output terminal 6. The "H" level output of the NAND gate 11 is applied to the inverter 2, inverted therein, and further applied to the one input terminal of NAND gate 11. Thus, the output of the NAND gate 11 is latched in the "H" level and output data DO is reset to the "L" level. Thereafter, when an "H" level signal is applied to the reset terminal 7, the reset state is released, and the NAND gate 11 and the inverter 2 latch the input data DI (the c-th one in FIG. 1), in response to a rising of the next clock signal. The latched data is applied to the output terminal 6 through the inverter 3.

FIG. 11 is a diagram showing a semiconductor integrated circuit device with a conventional setting function. The semiconductor integrated circuit device shown in FIG. 11 is substantially identical to the semiconductor integrated device shown in FIG. 9 with essential differences being that a set terminal 8 for receiving a set signal set is provided in place of the reset terminal 7, and a 2-input NOR gate 12 is provided in place of the 2-input NAND gate.

FIG. 12 is a timing chart for use in illustration of the semiconductor integrated circuit device shown in FIG. 11. Referring to FIG. 12, an operation of the semiconductor integrated circuit device shown in FIG. 11 will be described.

When an "L" level signal is applied to the set terminal 8, the output of the NOR gate 12 is decided by the input data DI applied to the input terminal 5. This is the same as the operation of the semiconductor integrated circuit device shown in FIG. 9.

When an "H" level signal is applied to the set terminal 8, the NOR gate 12 outputs an "L" level signal regardless of the data at the input terminal 5. The output is applied to the inverters 2 and 3, and the data applied to the inverter 3 (the "L" level) is inverted therein and then applied to the output terminal 6. The data applied to the inverter 2 is inverted therein and then applied to the one input terminal of the NOR gate 12. Thus, the output of the NOR gate 12 is latched in the "L" level and the output terminal 6 is set to the "H" level.

The semiconductor integrated circuit device having a conventional setting or resetting function structured as described above requires a gate circuit having at least two input terminals for additionally providing the setting or resetting function. The conventional device is therefore encountered with the disadvantage that it requires a number of transistors for forming the gate circuit, thus impeding the size of the device from being reduced.

SUMMARY OF THE INVENTION

It is an object of the invention to simplify a circuit for conducting a setting/resetting operation in a semiconductor integrated circuit device with a data latch function.

Another object of the invention is to reduce the number of transistors necessary for a circuit for conducting a setting/resetting operation and reduce the size of the device in a semiconductor integrated circuit device having a data latch function.

A further object of the invention is to simplify a circuit for conducting a setting/resetting operation in a semiconductor memory device.

More briefly stated, a semiconductor integrated circuit device in accordance with the invention includes a data accept circuit, first and second switching elements, an inverter, and a set/reset terminal. The data accept circuit accepts externally applied data in response to a clock signal. The first and second switching elements each include a control electrode, one electrode and the other electrode, and are turned on/off in a complementary manner in response to data accepted by the data accept circuit. The inverter has its input node commonly connected to the one electrodes of the first and second switching elements, and its output node connected to the control electrodes of the first and second switching elements. The set/reset terminal applies a signal for setting/resetting a data latch function to the other electrodes of the first and second switching elements.

In operation, the first and second switching elements are turned on/off in a complementary manner, in response to data accepted by the data accept circuit. More specifically, the first and second switching elements constitute an inverter. The inverter constituted by the first and second switching elements and another inverter constitute a data latch circuit. Since the first and second switching elements apply a set/reset signal applied to the other electrode to the inverter through the one electrode, the output of the inverter can be in the "L" level or the "H" level. Thus, the setting or resetting function can be achieved by a simple structure. Since one of the two inverters constituting the latch circuit is formed of the two switching elements, the number of transistors necessary for the circuit for conducting setting/resetting operation can be reduced, thus reducing the size of the semiconductor integrated circuit device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a timing chart for use in illustration of the semiconductor integrated circuit device shown in FIG. 11.

DESCRIPTION OF THE PREFERRED EMBODIMENTS

Figure 1:
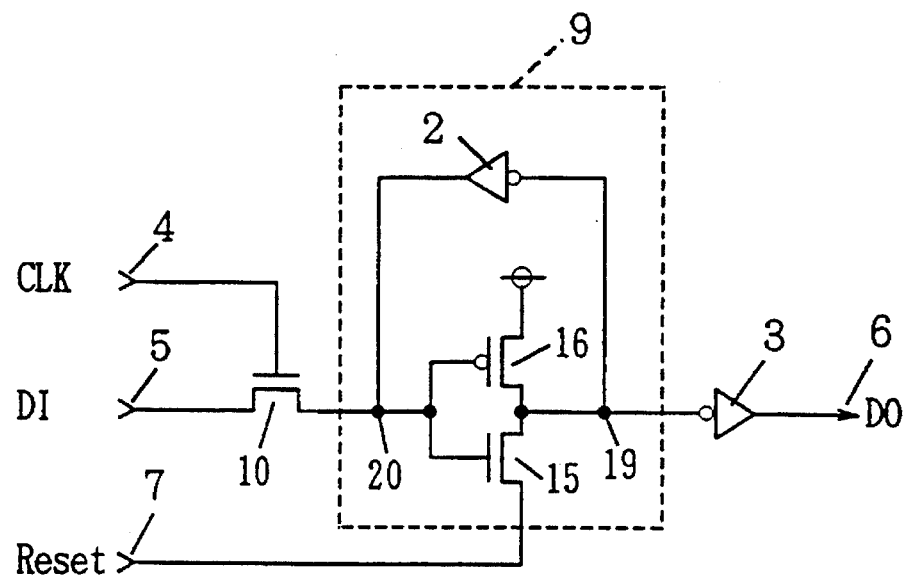
FIG. 1 is a circuit diagram showing a semiconductor integrated circuit device with a resetting function in accordance with a first embodiment of the invention.

FIG. 1 is a circuit diagram showing a first embodiment of the invention.

Figure 9:
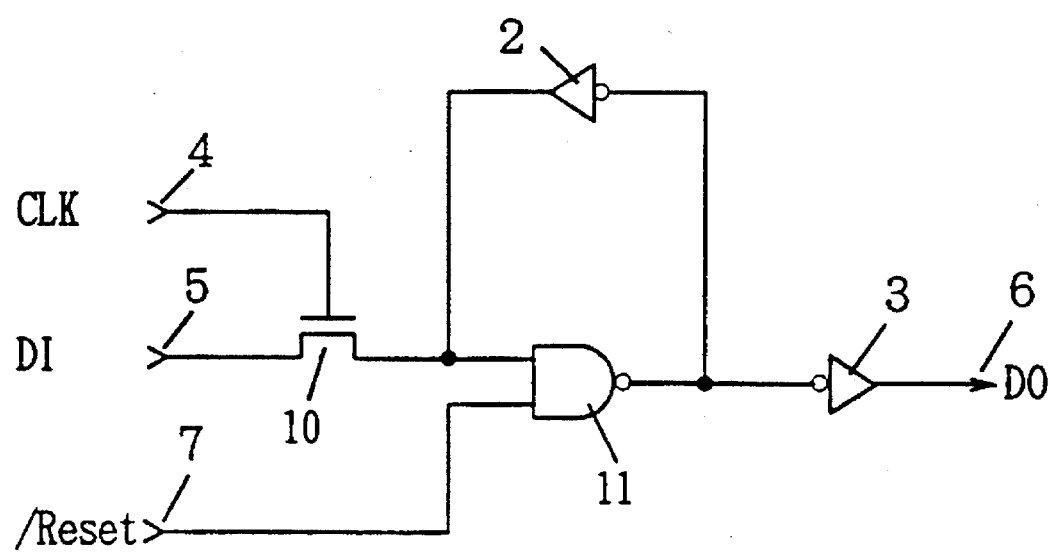
FIG. 9 is a circuit diagram showing a conventional semiconductor integrated circuit device with a resetting function.

A semiconductor integrated circuit device shown in FIG. 1 is substantially identical to the semiconductor integrated circuit device shown in FIG. 9 with essential difference that an NMOS transistor 15 and a PMOS transistor 16 are provided in place of the NAND gate. The other circuit elements are identical to those in FIG. 9, and denoted with the same reference characters, and description thereof will be omitted.

The N channel transistor 15 has its gate electrode together with the gate electrode of the PMOS transistor 16 commonly connected to the drain electrode of the NMOS transistor 10 and the output terminal of the inverter 2, its drain electrode together with the drain electrode of the PMOS transistor 16 commonly connected to the inputs of the inverters 2 and 3, and its source electrode connected to a reset terminal 7. The PMOS transistor 16 has its source electrode coupled to a power supply potential.

A description of an operation of the semiconductor integrated circuit device shown in FIG. 1 follows. The semiconductor integrated circuit device operates in accordance with a timing the same as the timing chart in FIG. 10 described above.

Figure 7:
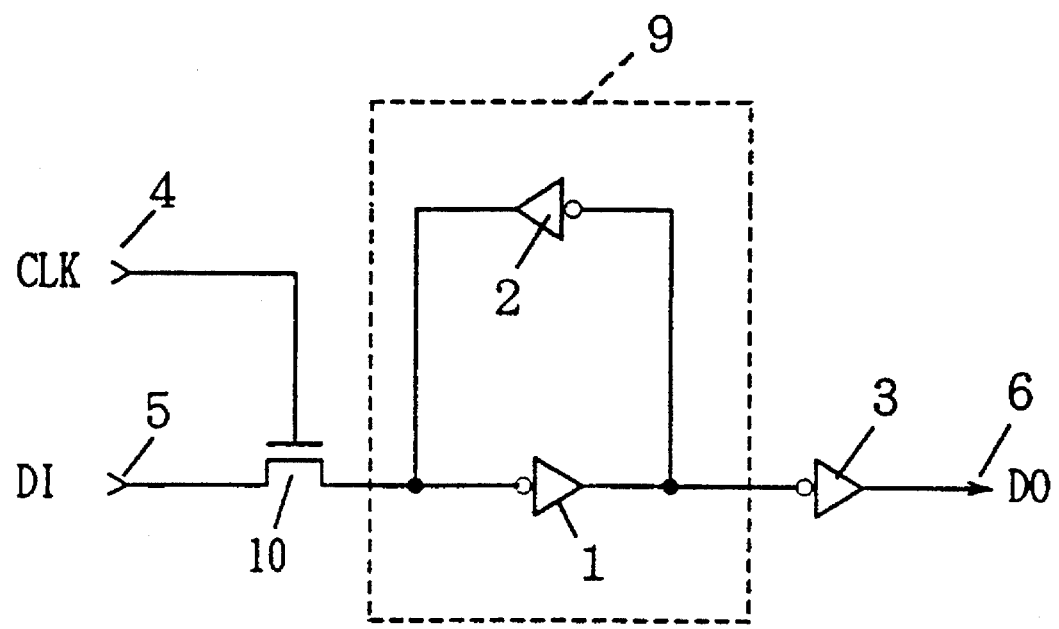
FIG. 7 is a circuit diagram showing a conventional semiconductor integrated circuit device without a latch function.
Figures 8A, 8B, 8C:
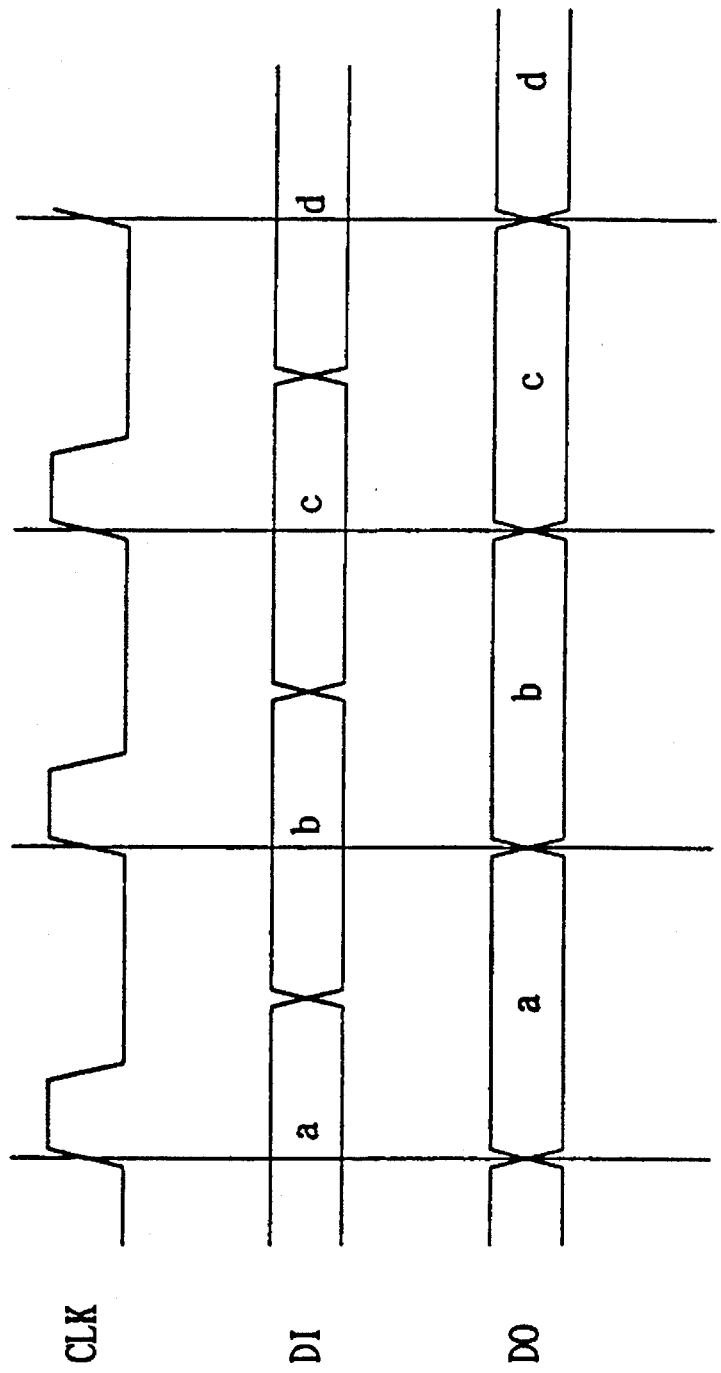
FIG. 8 is a timing chart for use in illustration of the semiconductor integrated circuit device shown in FIG. 7.

When a reset signal Reset is in an "L" level, the source electrode of the NMOS transistor 15 is pulled to an "L" level, in other words a GND level. Therefore, in this case, the NMOS transistor 15 and the PMOS transistor 16 constitute an inverter. Consequently, as is the case with the semiconductor integrated circuit device shown in FIG. 7, the device conducts a latch operation in response to a clock signal.

An operation when the reset signal Reset is in the "H" level will be described. When the output level of the output terminal 6 is in an "H" level, the output node 19 is in an "L" level, the NMOS transistor 15 is in an on state, and the PMOS transistor 16 is in an off state. When an "H" level signal is applied to the reset terminal 7 in this state, the applied "H" level signal is transferred through the source-drain region of the NMOS transistor 15 in the on state to the output node 19, bringing the output node 19 to the "H" level. The inverter 2 outputs an "L" level signal in response. Thus, the PMOS transistor 16 conducts, with the NMOS transistor 15 being turned off, the "H" level signal will be latched to the output node 19. When the "H" level signal is transferred to the output node 19, the signal is inverted to the "L" level signal by the inverter 3 and then output through the output terminal 6.

Conversely, when the "L" level signal is output to the output terminal 6, the node 19 is in the "H" level. More specifically, the PMOS transistor 16 is turned on, and the NMOS transistor 15 is turned off. At that time, application of the "H" level signal to the reset terminal 7 will not give any effect to the latched data (in other words, the "H" level at the output node 19 and the "L" level at the output terminal 6), because the NMOS transistor 15 is turned off. Accordingly, when the "L" level signal is output to the output terminal 6, a state equivalent to the state in which a resetting operation is going on is created.

As described above, application of the "H" level signal as a reset signal to the source electrode of the NMOS transistor 15 causes the potential of the output terminal 6 to be reset to the "L" level. The clock signal CLK has to be in the period of the "L" level for negating the reset terminal 7, and after the negating, a reset cycle is released in response to a next rising of the clock signal CLK, starting accepting data once again.

Figure 2:
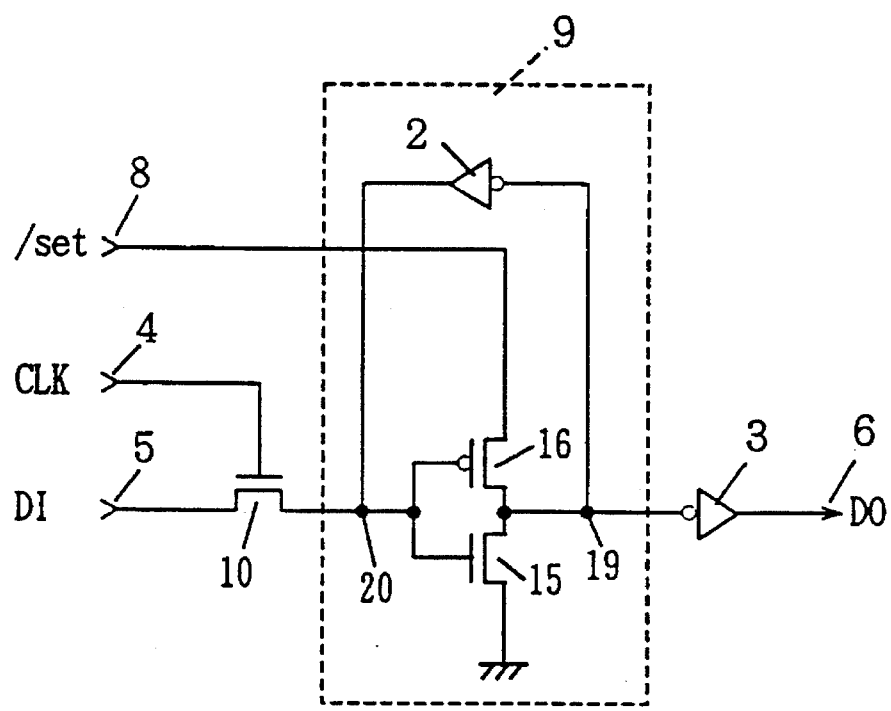
FIG. 2 is a circuit diagram showing a semiconductor integrated circuit device with a setting function in accordance with a second embodiment of the invention.

FIG. 2 is a circuit diagram showing a second embodiment of the invention. The semiconductor integrated circuit device is different from the semiconductor integrated circuit device shown in FIG. 1 in that a set terminal 8 is provided in place of the reset terminal, the set terminal 8 is connected to the source electrode of the PMOS transistor 16, and the source electrode of the NMOS transistor 15 is grounded.

In operation, when a set signal/set is in the "H" level, the state is equivalent to application of a power supply voltage to the source electrode of the PMOS transistor 16, and the NMOS transistor 15 and the PMOS transistor 16 form an inverter. Therefore, as is the case with the semiconductor integrated circuit device shown in FIG. 7, a latch operation is conducted in response to the clock signal CLK.

An operation when an "L" level signal is applied to the set terminal 8 will be described. When the output terminal 6 is in "L" level, the output node 19 is in the "H" level, the PMOS transistor 16 is in an on state, and the NMOS transistor 15 is in an off state. When an "L" level signal is applied to the set terminal 8 in this state, the applied "L" level is transferred to the node 19 through the source/drain region of the PMOS transistor 16 in the on state. Thus, the node 19 is forced to be in the "L" level. The inverter 2 outputs the "H" level signal in response while the NMOS transistor 15 is turned on, and the PMOS transistor 16 is turned off. Thus, the output node 19 is latched to the "L" level, while the output terminal 6 is set to the "H" level.

When the "H" level signal is output to the output terminal 6, the node 19 is in the "L" level, the PMOS transistor 16 is in an off state, and the NMOS transistor 15 is in an on state. Application of the "L" level signal to the set terminal 8 will not give any effect on data latched at the output node 19, because the PMOS transistor 16 is in the off state. The output node 19 is therefore still in the "L", and the output terminal 6 is in the "H" level. Accordingly, the state in which the "H" level signal is output to the output terminal 6 is equivalent to conducting a setting operation.

As described above, whether the latch output is in the "H" level or in the "L" level, a setting operation can be conducted by applying the "L" level signal to the set terminal 8 thereby pulling the level of the output terminal 6 to the "H" level.

Figure 3:
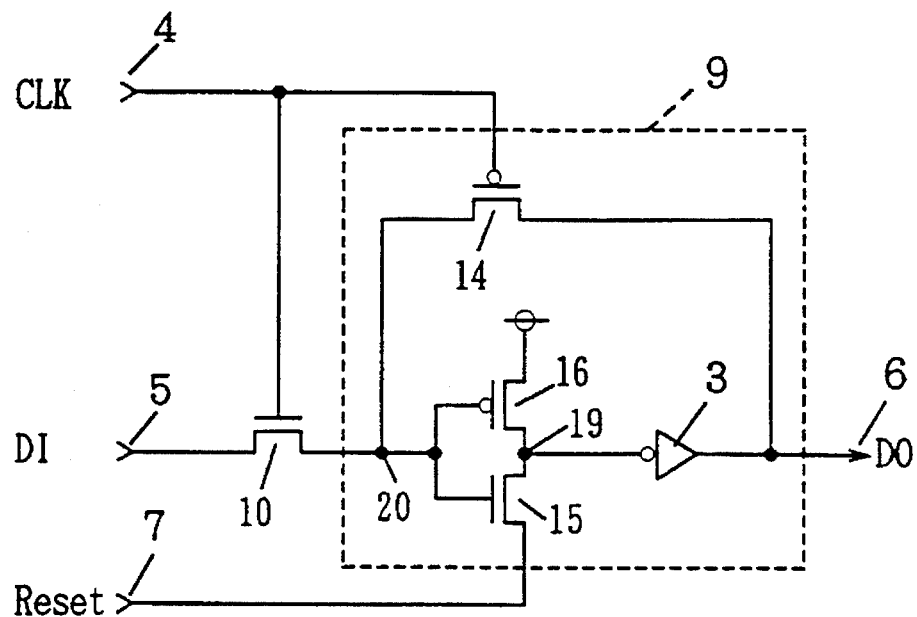
FIG. 3 is a circuit diagram showing a third embodiment of the invention.

FIG. 3 is circuit diagram showing a third embodiment of the invention. The semiconductor conductor integrated circuit device shown in FIG. 3 is substantially identical to the semiconductor integrated circuit device shown in FIG. 1 with an essential difference being that a PMOS transistor 14 is provided between the output terminal of the inverter 3 and the input node 10 as a transmission gate in place of the inverter 2. The PMOS transistor 14 responds to a clock signal CLK applied to its gate electrode, and causes the output of the inverter 3 to be fed back to an input node 20. When the "L" level is applied to the reset terminal 7, the PMOS transistor 16 and the NMOS transistor 15 constitute an inverter. Consequently, the PMOS transistor 16, the NMOS transistor 15, the inverter 3, and the PMOS transistor 14 constitute a latch circuit.

Figures 10A, 10B, 10C, 10D, 10E:
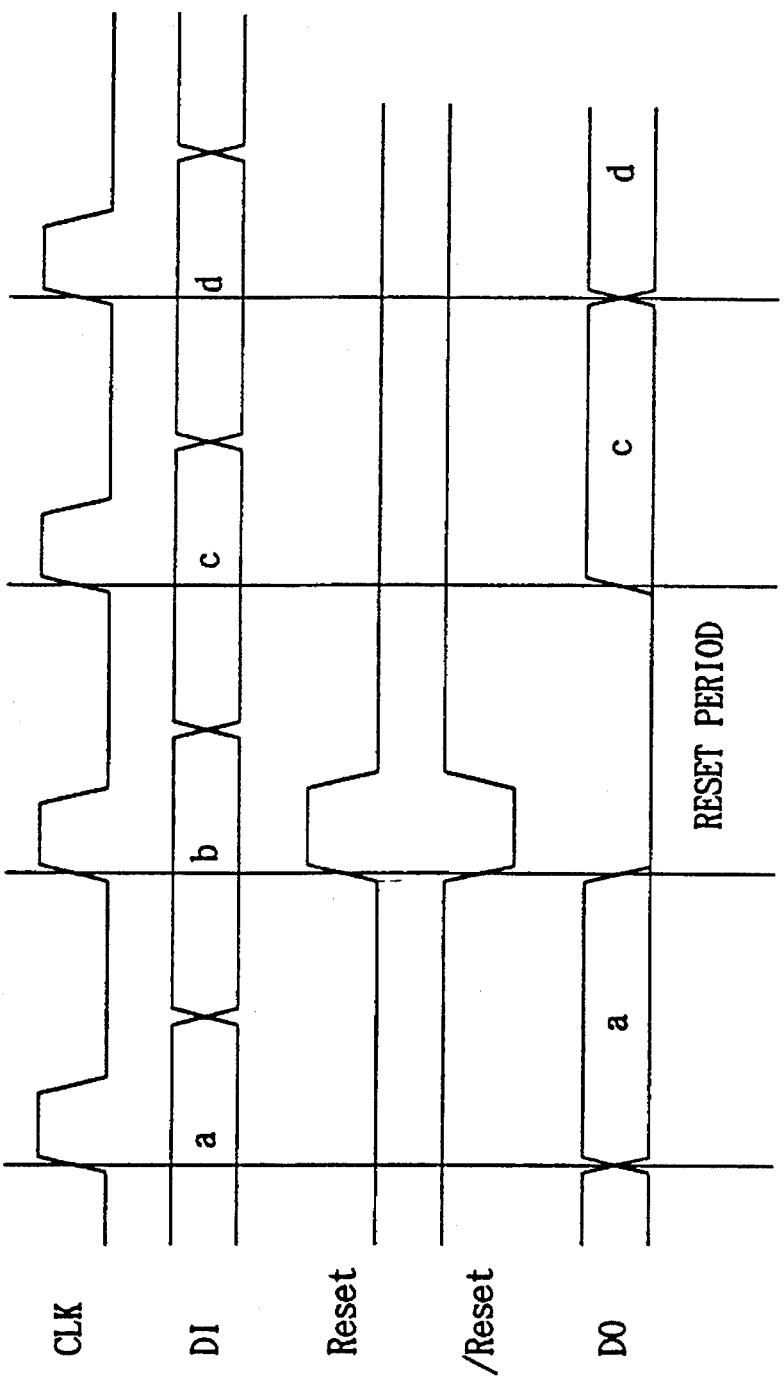
FIG. 10 is a timing chart for use in illustration of the semiconductor integrated circuit device shown in FIG. 9.
Figure 11:
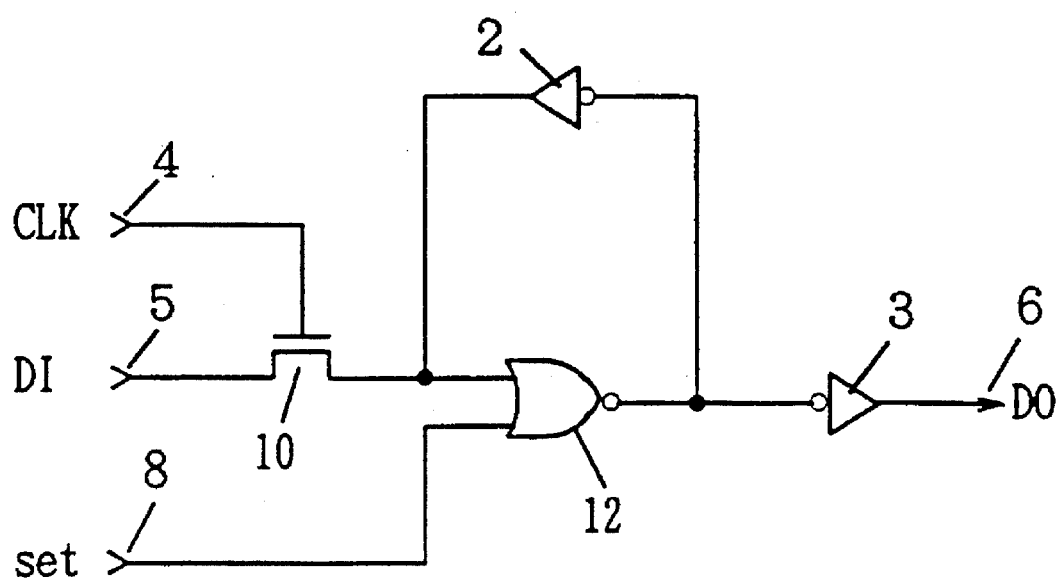
FIG. 11 is a circuit diagram showing a conventional semiconductor integrated circuit device with a setting function.

When the "H" level is applied to the reset terminal, the output node 19 is latched to the "H" level, and the level of the output terminal 6 is reset to the "L" level, whether input data DI is in the "H" level or in the "L" level as is the case with the embodiment shown in FIG. 10.

In the embodiment shown in FIG. 3, since a PMOS transistor is utilized as a transmission gate in place of the inverter 3, the number of transistors can be reduced as compared to the embodiment shown in FIG. 1.

In the third embodiment, the semiconductor integrated circuit device with a resetting function has been described, a setting function may be provided instead of the resetting function.

Figure 4:
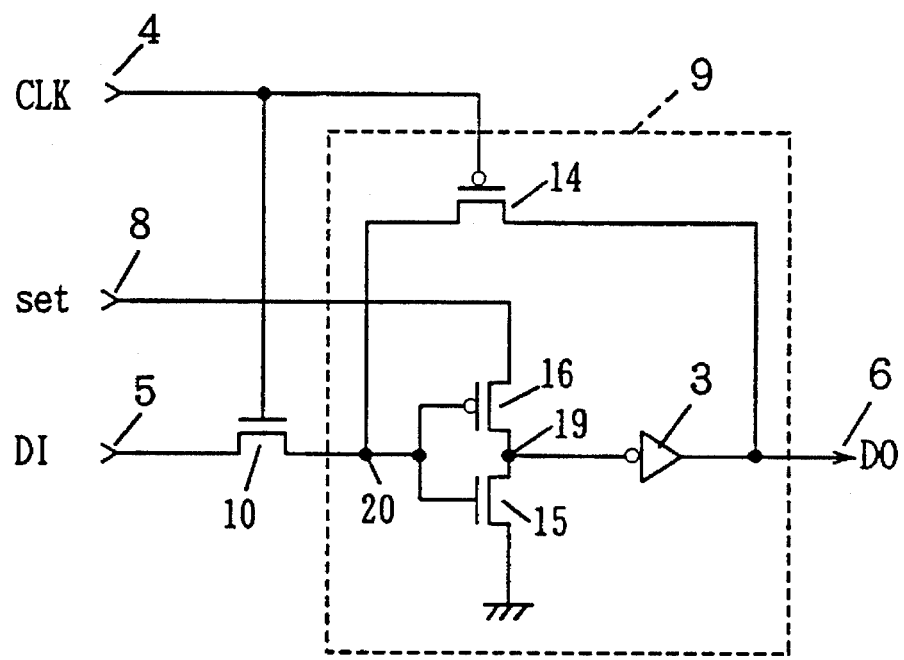
FIG. 4 is a circuit diagram showing a fourth embodiment of the invention.

FIG. 4 is a circuit diagram showing a fourth embodiment of the invention. The semiconductor integrated circuit device is substantially identical to the semiconductor integrated circuit device shown in FIG. 3 with essential difference being that the source electrode of the PMOS transistor 16 is connected to the set terminal 8, and the source electrode of the NMOS transistor 15 is grounded. The semiconductor integrated circuit device can set the output terminal 6 to the "H" level, in response to a set signal/set applied to the set terminal 8.

Figure 5:
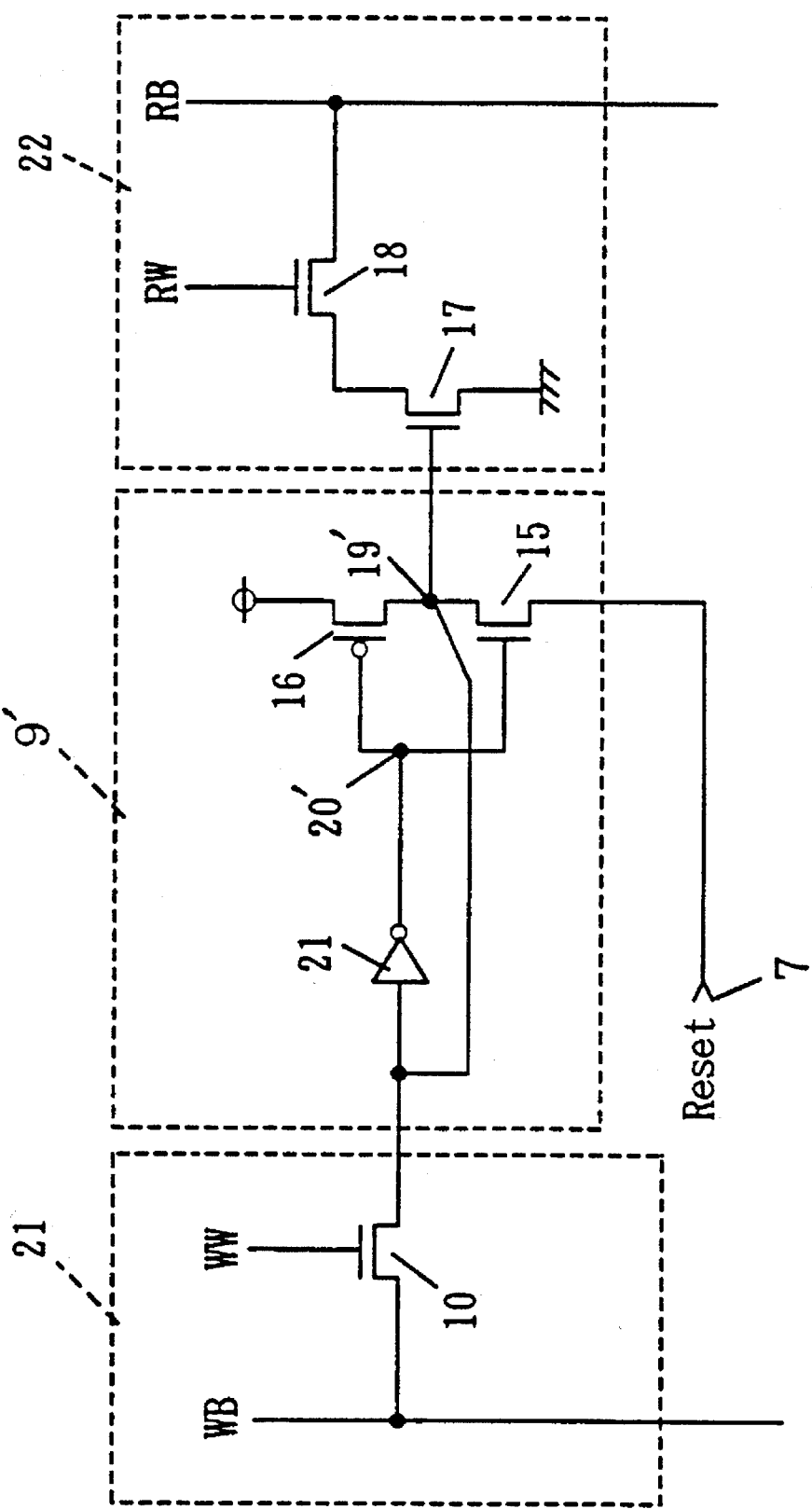
FIG. 5 is a circuit diagram showing a fifth embodiment of the invention.

FIG. 5 is a circuit diagram showing a fifth embodiment of the invention. This semiconductor integrated circuit device includes a memory cell 9', a port dedicated to writing 21, and a port dedicated to reading 22. The memory cell 9' includes a storage node 2', a reading node 19', an inverter 23, an NMOS transistor 15, and a PMOS transistor 16. The circuit shown in FIG. 5 corresponds to the latch circuit shown in FIG. 15. The port dedicated to writing 21 includes a write bit line WB, a write word line WW, and an NMOS transistor 10. A signal applied to the write bit line WB corresponds to the date input DI shown in FIG. 1, and a signal applied to the write word line WW corresponds to the clock signal CLK shown in FIG. 10. The port dedicated to reading 22 includes a read bit line RB, a read word line RW, and NMOS transistors 17 and 18.

A description of an operation when the semiconductor integrated circuit device shown in FIG. 5 is reset follows. When an "H" level signal is applied to the reset terminal 7, the read node 19' is latched to the "H" level as described in conjunction with FIG. 1. The NMOS transistor 17 is turned on in response, and the read bit line RB is coupled to the ground potential through the NMOS transistors 17 and 18. Thus, the potential of the read bit line RB is reset to the "L" level.

As in the foregoing, the number of transistors necessary for a memory device with a resetting function having the ports dedicated to writing and reading can be reduced.

Figure 6:
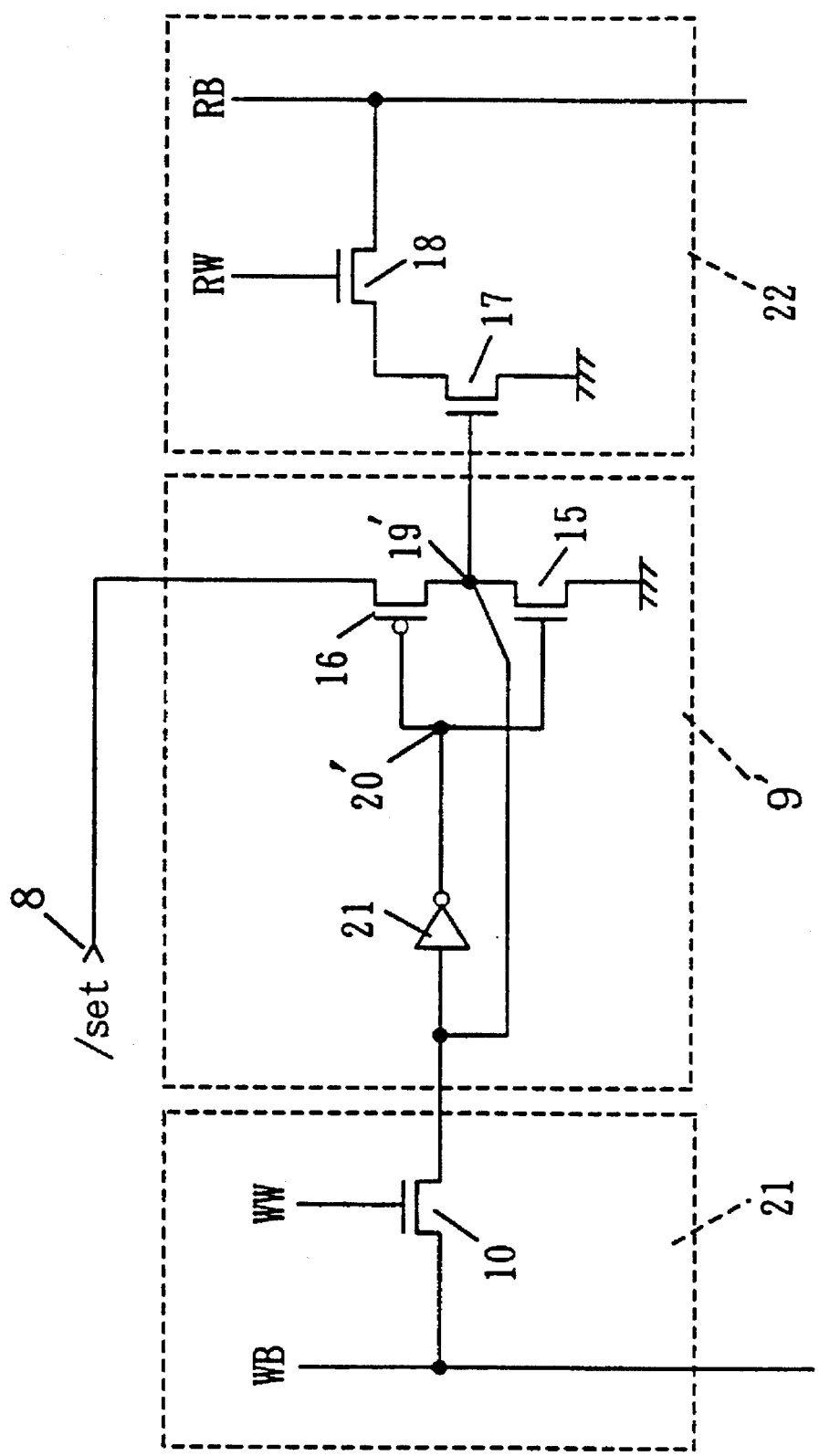
FIG. 6 is a diagram showing a sixth embodiment of the invention.

Although in this embodiment, the memory device with a resetting function has been described, a setting function can be provided to the device instead of the resetting function as illustrated in FIG. 6.

Also, in the first to fifth embodiments, NMOS transistors or PMOS transistors are utilized as a transmission gate, but a complementary type transistor (CMOS transistor) may be used in place of these transistors.

Furthermore, as for the source terminal of the transistors connected to the set or reset terminal, any transistor can be applied to a latch circuit if it can constitute an inverter.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a data storage node and a data reading node, comprising:

write data transfer means responsive to a write control signal for transferring externally applied write data to said data storage node;

first and second switching means each including a control electrode, one electrode and the other electrode, and responsive to the write data transferred by said write data transfer means for being turned on/off in a complementary manner;

an inverter having its input node connected together with the one electrodes of said first and second switching means to the data reading node, and its output node connected together with the control electrodes of said first and second switching means to said data storage node;

a set/reset terminal for setting/resetting a data latch function to the other electrode of said first or second switching means, and read data transfer means responsive to a read control signal for externally transferring read data from said data reading node.

2. A semiconductor integrated circuit device as recited in claim 1, wherein said write data transfer means includes a write bit line for inputting write data, and write accept means connected between said write bit line and the input node of said inverter and responsive to the write control signal for being turned on/off.

3. A semiconductor memory device as recited in claim 1, wherein said read data transfer means includes a read bit line for outputting the read data, and fourth and fifth MOS transistors of the same conductivity type, said fourth MOS transistor having its gate electrode connected to said data reading node, its one electrode connected to GND, and its the other electrode connected to one electrode of said fifth MOS transistor, the fifth MOS transistor having its the other electrode connected to the read bit line, and its gate electrode connected to receive the read control signal.

* * * * *